(12) United States Patent
Anandarajah et al.

(10) Patent No.: US 9,197,326 B2
(45) Date of Patent: Nov. 24, 2015

(54) OPTICAL WAVELENGTH COMB GENERATOR DEVICE

(75) Inventors: Prince Anandarajah, Dublin (IE); Liam Barry, Dublin (IE)

(73) Assignee: Dublin City University, Dublin (IE)

( * ) Notice: Subject to any disclaimer, the term of this patent is extended or adjusted under 35 U.S.C. 154(b) by 0 days.

(21) Appl. No.: 13/257,917

(22) PCT Filed: Mar. 19, 2010

(86) PCT No.: PCT/EP2010/053649
§ 371 (c)(1),
(2), (4) Date: Dec. 2, 2011

(87) PCT Pub. No.: WO2010/106184
PCT Pub. Date: Sep. 23, 2010

(65) Prior Publication Data
US 2012/0063476 A1     Mar. 15, 2012

(30) Foreign Application Priority Data

Mar. 20, 2009   (GB) .................................. 0904831.5

(51) Int. Cl.
*H01S 3/00*         (2006.01)
*H04B 10/50*        (2013.01)
*H01S 5/042*        (2006.01)
(Continued)

(52) U.S. Cl.
CPC ............ *H04B 10/506* (2013.01); *H01S 5/0427* (2013.01); *H01S 5/0653* (2013.01); *H01S 5/0687* (2013.01); *H01S 5/005* (2013.01);
(Continued)

(58) Field of Classification Search
CPC ....... H01S 5/042; H01S 5/0687; H01S 5/005; H01S 5/0085; H01S 5/0427; H01S 5/0658; H01S 5/06213; H04B 10/506; H04J 14/02
USPC .................................. 372/38.1, 38.02, 38.07
See application file for complete search history.

(56) References Cited

U.S. PATENT DOCUMENTS 5,181,213 A * 1/1993 Shinokura et al. .............. 372/30
5,519,362 A   5/1996 Li et al.
(Continued)

FOREIGN PATENT DOCUMENTS

GB          2144912 A      3/1985

OTHER PUBLICATIONS

Koch, B. R. et al., "Silicon Evanescent Optical Frequency Comb Generator," 5th IEEE International Conference on Group IV Photonics, Sorrento, Italy, Sep. 17-19, 2008, pp. 64-66.
(Continued)

*Primary Examiner* — Yuanda Zhang
(74) *Attorney, Agent, or Firm* — Seed IP Law Group PLLC

(57) ABSTRACT

The present application relates to comb frequency generator devices generally and more particularly to the use of comb generators for use in fibre optic communications. More particularly, the application provides a frequency comb generator device. The device comprises a laser (30), a biasing circuit for providing a DC bias current (26), an RF circuit (22) providing a RF signal and a drive circuit (28) for combining the RF signal with the DC bias current to provide a drive current to the laser (30). With the DC bias current below threshold of the laser diode and RF bias with a frequence close to the relaxation ascillation frequency of the laser diode, a periodic pulse train is emitted with constant phase.

15 Claims, 4 Drawing Sheets

(51) Int. Cl.
*H01S 5/0687* (2006.01)
*H01S 5/00* (2006.01)
*H01S 5/062* (2006.01)
*H01S 5/065* (2006.01)
*H04J 14/02* (2006.01)

(52) U.S. Cl.
CPC ............ *H01S5/0085* (2013.01); *H01S 5/0658* (2013.01); *H01S 5/06213* (2013.01); *H04J 14/02* (2013.01)

(56) References Cited

U.S. PATENT DOCUMENTS

| | | | | |
|---|---|---|---|---|
| 6,064,682 | A * | 5/2000 | Vickers | 372/38.04 |
| 6,567,440 | B1 * | 5/2003 | Hirata et al. | 372/38.02 |
| 2003/0202794 | A1 * | 10/2003 | Izadpanah et al. | 398/115 |
| 2006/0120417 | A1 * | 6/2006 | Wang et al. | 372/30 |
| 2006/0215716 | A1 * | 9/2006 | Luo et al. | 372/38.08 |
| 2007/0189348 | A1 * | 8/2007 | Kovsh et al. | 372/45.01 |
| 2008/0170858 | A1 * | 7/2008 | Barry et al. | 398/87 |

OTHER PUBLICATIONS

Simler, Y. et al., "Pulsation Stabilization and Enhancement in Self-Pulsating Laser Diodes," IEEE Photonics Technology Letters 4(4):329-332, Apr. 1992.

International Search Report, mailed Jun. 7, 2010, for PCT/EP2010/053649, 5 pages.

Written Opinion, mailed Jun. 7, 2010, for PCT/EP2010/053649, 10 pages.

International Preliminary Report on Patentability relating to International Patent Application No. PCT/EP2010/053649, dated Sep. 20, 2011, 9 pages.

* cited by examiner

OPTICAL WAVELENGTH COMB GENERATOR DEVICE

FIELD

The present application relates to comb wavelength generator devices generally and more particularly to the use of comb generators for use in fibre optic communications.

BACKGROUND

Optic communications systems are widely deployed in the core infrastructure of networks. However, the roll out and use of fibre in the access network, frequently referred to as the last mile, remains largely constrained due to cost and return on investment issues.

More efficient use of any given fibre allows for these costs to be reduced. One possibility for increasing the bandwidth is to employ higher modulation formats (for example QPSK or 16QAM) and to more closely pack channels. A problem with doing this is the need to generate a number of equally spaced, low linewidth optical signals that are coherent in phase and locked to a common reference oscillator—a coherent comb source. These comb sources may be referred interchangeably as frequency or wavelength combs.

One generally employed technique of generating an optical wavelength comb is to employ an amplitude modulator pair. An example of such a technique is provided in Fatima C. Garcia Gunning and Andrew D. Ellis "Generation of a widely spaced optical frequency comb using an amplitude modulator pair" Opto-Ireland 2005: Optoelectronics, Photonic Devices, and Optical Networks, Proc. of SPIE Vol. 5825 (SPIE, Bellingham, Wash., 2005). An example of such a wavelength comb generator device 1, as shown in FIG. 1, comprises a laser source 2, the output of which is fed through two modulators 4 and 6 in series to provide a wavelength comb output 8. To obtain this output, the modulators are in turn driven by a sinusoidal signal, for example approximately 40 GHz, which is amplified by amplifiers 10, 12 providing drive signals to the modulators. The sinusoidal signal provided to the second modulator may be phase shifted by a phase shifter 14.

Whilst these techniques are effective, a problem with these existing comb generation techniques is that the modulators are expensive and bulky.

The present application seeks to provide an alternative comb generator.

SUMMARY

Accordingly, a first embodiment provides an optical wavelength comb generator device comprising a laser, a biasing circuit for providing a DC bias current, an RF circuit providing a RF signal, and a drive circuit for combining the RF signal with the DC bias current to provide a drive current to the laser.

Suitably, the laser bias current is selected to be close to the threshold current of the laser device and more particularly within 20% of the threshold current.

The RF signal is suitably selected to be a substantially sinusoidal signal. The frequency of the RF signal is suitably selected to be close to the relaxation oscillation frequency of the laser and preferably within 25% of the relaxation oscillation frequency of the laser.

An advantage of the embodiment is that the comb generator is coherent.

The laser may be temperature stabilised.

The device may further be employed in a communications system with an optical splitter to separate individual frequencies of the output from the laser to provide a plurality of outputs from the laser device. The splitter may be, for example, an Arrayed Waveguide Grating. The communication system may further comprise a plurality of modulators, each modulator modulating an output from the splitter to provide a modulated output. The outputs from the arrayed waveguide grating or the optical splitter may be provided as inputs to a plurality of fibre optic cables, each fibre receiving one of the split or modulated outputs as an input.

A further embodiment provides a method of operating a laser to provide a comb output, the method comprising the step of driving the laser with a DC bias current and a RF signal. Suitably, the RF signal comprises a substantially sinusoidal signal. The frequency of the RF signal may be selected to be close to the relaxation oscillation frequency of the laser, preferably the frequency of the RF signal is within 25% of the relaxation oscillation frequency of the laser.

The bias current is suitably selected to be close to the threshold current of the laser device, preferably within 20% of the threshold current. Advantageously, the output of the laser is coherent.

The laser may be temperature stabilised.

A further embodiment provides a method of manufacturing a comb generator device comprising the initial steps of selecting a type of laser, biasing one of the type of laser with a DC bias current and an RF signal, adjusting the frequency of the RF signal to determine the optimum frequency of the RF signal to produce a desired comb output, and further comprising the further steps of fabricating a laser device with a bias circuit having an output to provide a DC bias current and a RF signal generator having an output to provide a RF signal, and a drive circuit for combining the output from the DC bias circuit and the RF signal generator to provide a drive signal to the laser, wherein the RF signal generator is configured to operate at the determined optimum frequency.

The method may further comprise as an initial step the adjusting of the bias current to determine an optimum bias current for the desired comb output and wherein the DC bias circuit is configured to operate at the determined optimum bias current.

In this method, the initial frequency of the RF signal is selected to be approximately the relaxation oscillation frequency of the laser type.

DETAILED DESCRIPTION

The present application employs a conventional semiconductor single mode laser, including for example but not limited to ridge lasers.

In common with prior art techniques, the laser may be maintained at a preset temperature using appropriate circuitry and devices, including for example a Peltier device. As is known in the art, the frequency of the laser may be altered by adjusting its operating temperature.

In contrast to the complicated modulation techniques of the prior art which were directed at modulating the output produced from such a laser to obtain a desired comb output, the present application subjects the laser to direct modulation using an amplified sinusoidal RF signal as a modulation signal in conjunction with a suitable dc bias. By careful selection of the frequency and power of the modulation signal and the level of the DC bias, the resulting signal applied to the laser yields pulses in the temporal domain with a comb of frequencies in the spectral domain, i.e. the comb is produced by altering the electrical signals provided to the laser rather than by modifying the light output from the laser. It will be appreciated that the complexity, size and cost of biasing and modulation circuits are considerably less than the equivalent hardware required for the prior art post lasing techniques.

More particularly, the essence of the present application is that the laser is operated at a frequency close to its relaxation oscillation frequency, so that the build up of each pulse occurs close to the end of the preceding pulse, so that coherence is maintained between consecutive pulses. This effect causes the inter-pulse timing jitter to be minimised and the phase relationship of the optical signal to be maintained between the consecutive pulses. The frequency domain of this periodic pulse train therefore yields a comb of low line width tones that are phase coherent.

Figure 5:
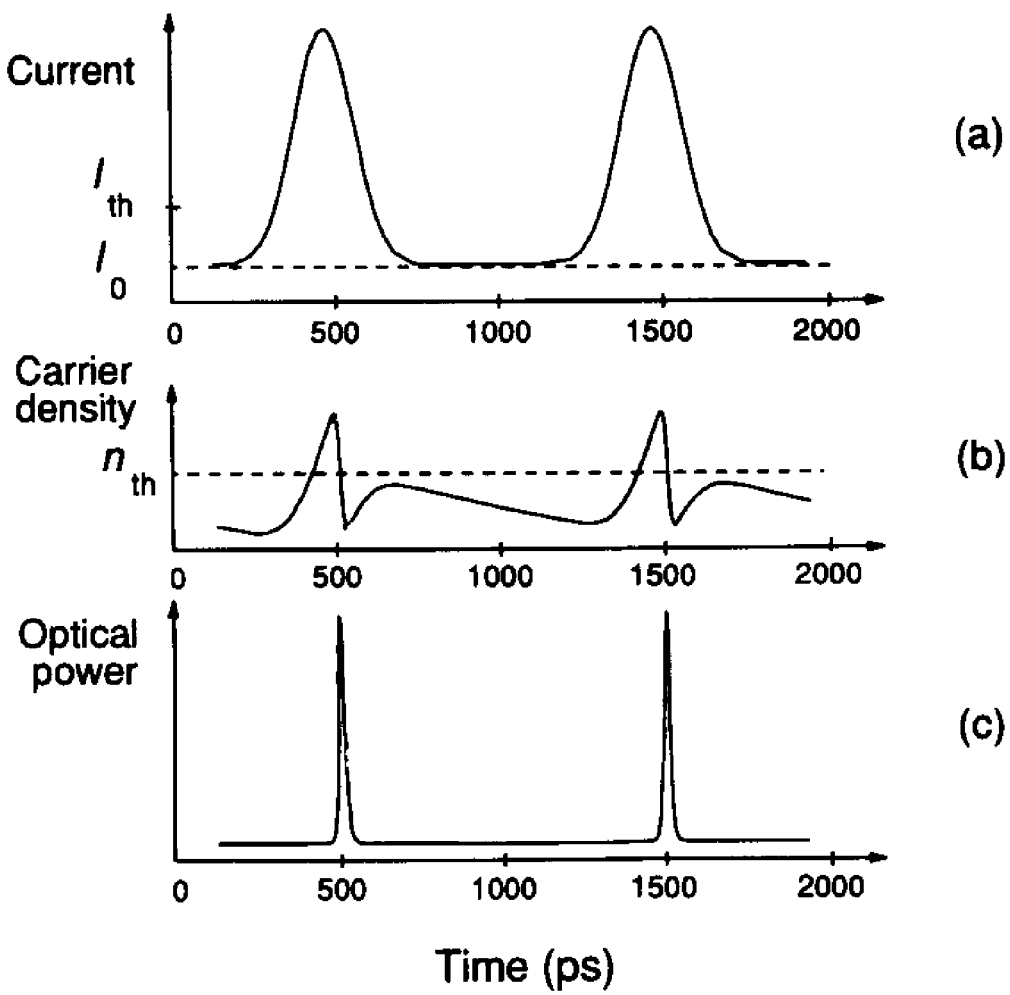
FIG. 5 illustrates the mode of operation of a conventionally operated pulse laser with (a) applied current (b) carrier density and (c) output optical pulses shown separately.

The mode of operation may be further explained by contrasting the mode of operation with that of a conventionally operated gain switched laser and FIG. 5 in which is illustrated the typical evolution of the photon and electron density, which takes place during the generation of ultra-short optical pulses by gain-switching a laser diode.

The laser is biased with a DC current ($I_o$), which is below threshold ($I_{th}$) as shown in 5(a). A large amplitude pulsed current is then applied to the laser, which is also shown in the same 5(a). Since the laser is biased below threshold, the initial photon density is very low and since the stimulated emission rate is proportional to the photon density, the photon density increases at a very slow rate.

Figure 1:
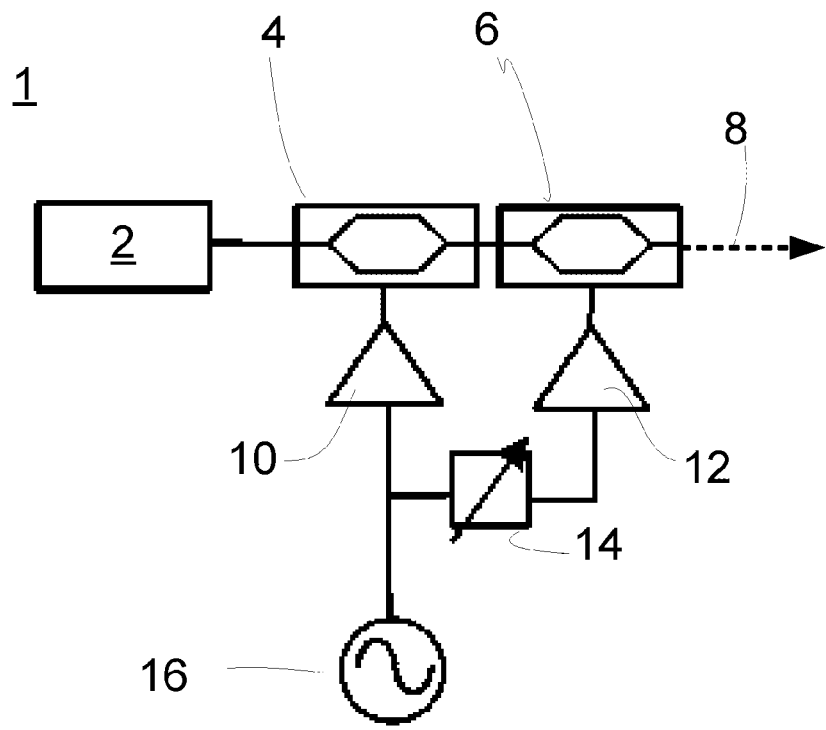
FIG. 1 is an example of a prior art wavelength comb generator device.
Figure 2:
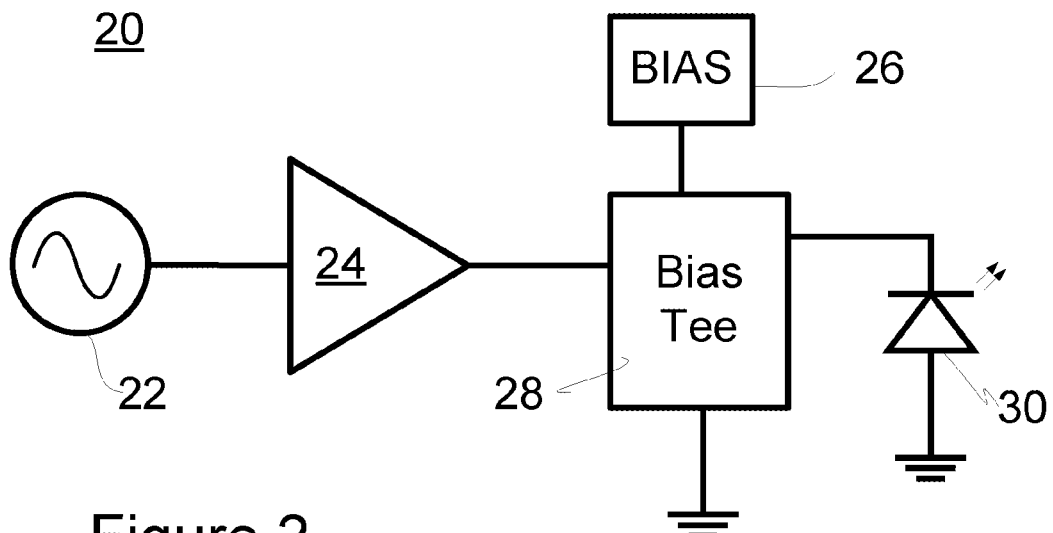
FIG. 2 is an exemplary comb generator device according to the present application.

In the absence of a sizable amount of stimulated emission, the carrier concentration increases rapidly in the laser. When the electric pulse increases the injected carrier density above the carrier density threshold ($n_{th}$), lasing starts. The typical time development of the carrier density is shown in FIG. 5(b). At a certain point (peak inversion point [$n_i$]) the generated photon population rapidly depletes the electron concentration. If the current pulse is cut off at the appropriate time, as the photon and electron densities are decreasing after the initial peak, then the second oscillation will not be obtained. That is to say that above $n_{th}$, the carrier density reaches $n_i$, lasing occurs and represses the increase in carrier density and consequently $n_i$ is pulled down to $n_f$. Therefore further lasing is prevented if the current is abruptly terminated after the charge carrier concentration is exceeded so that only a single resonance spike is generated (preventing further relaxation oscillations to occur). If the current pulse is not cut off the photon density will then oscillate at the resonant frequency before settling down to its steady state value. The present application seeks to drive the laser with a signal having a frequency close to that of the relaxation oscillations An exemplary circuit arrangement 20 for driving a laser 30 to provide an output having a comb frequency characteristic, as shown in FIG. 2, comprises a bias circuit 26 which is used to provide a DC bias. DC bias circuits would be familiar to those skilled in the art. The level of the DC bias is selected to provide a current close to the threshold current of the laser. Suitably, the DC bias is selected to be just below the threshold of the laser. It will be appreciated that the level of bias required will be dependent on the laser, but a typical value for the bias would be of the order of 10 mA to 60 mA.

The arrangement further comprises a RF signal generator 22, which may for example be a voltage controlled oscillator, possibly stabilised with a Phase Locked Loop, providing a RF output signal. The RF signal is selected to correspond approximately to the relaxation oscillation frequency of the laser. The RF signal is suitably sinusoidal. The relaxation oscillation frequency of the laser may be determined roughly by finding the peak in its frequency response which occurs at a frequency slightly less than the RF bandwidth of the laser. The RF signal is amplified by an amplifier 24 to provide a modulation signal. The DC bias is combined with the modulation signal using a bias tee 28 or similar circuit structure to provide a drive signal to the laser 30.

For the typical values of bias provided above, corresponding levels of the modulation signal would be about 30 dBm. It will be appreciated however that the values will vary depending on the operating characteristics of the laser.

In order to determine suitable operating parameters and\or to optimise the output of the laser a test set-up may be employed. In particular, the output of the laser may be optimised, using the set-up of FIG. 3, by connecting the output of the laser to a Optical Spectrum Analyser with suitably fine resolution (in the MHz region) and adjusting the dc bias (not shown) and the RF drive level and frequency to maximise the depth between the lines of the comb. This improves the contrast between the lines of the comb and the in-band noise. This inherently maximises the phase coherence between the lines and frequency stability of each individual line. It will be appreciated that this optimisation may be performed once when characterising a particular model of laser and then the values preset for the purposes of general manufacture.

Figure 3:
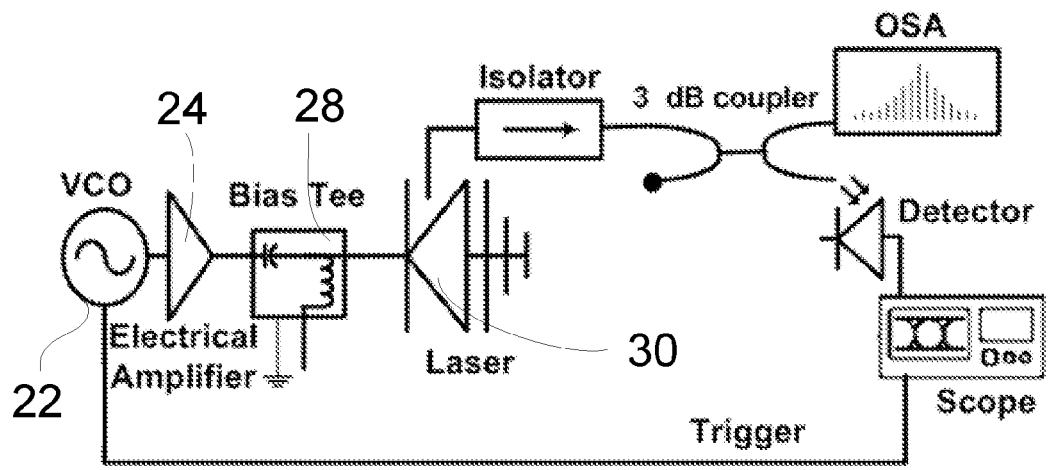
FIG. 3 is an exemplary test set-up for use with the comb generator device per the arrangement of FIG. 2, FIG. 4*a* and FIG. 4*b* are exemplary results obtained using the set-up of FIG. 3.
Figure 4A:
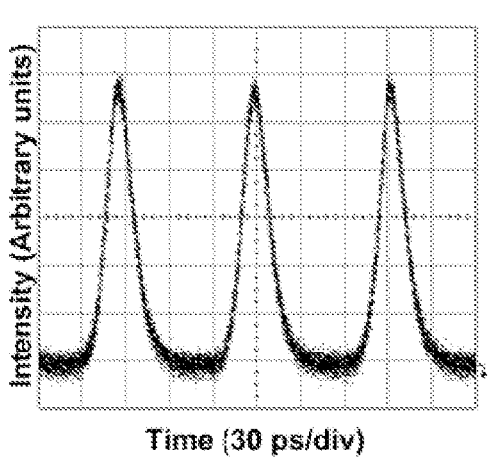
Figure 4B:
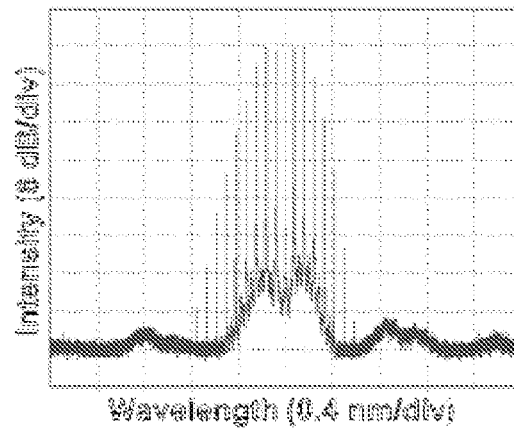

Some exemplary results were obtained using the set-up of FIG. 3. As can be seen from the generated pulse train of the laser shown in FIG. 4a and its corresponding optical spectrum shown in FIG. 4b a comb spectrum was generally produced. To verify the performance of the circuit, the linewidth of the individual tones were measured by removing the other tones with a Fabry-Perot optical bandpass filter. In one particular case, the linewidth of individual lines was measured to be 3.8 MHz. The linewidth of the complete signal was also measured with all the tones, yielding a linewidth of 4.5 MHz. To obtain such a result for the entire comb, each of the individual tones MUST be substantially coherent with all the others. In the case of an incoherent comb, the resultant linewidth is calculated as the linewidth of the individual lines, multiplied by SQRT (number of lines). So the 13 tones in this case which would give a total linewidth of 13.7 MHz. It will be appreciated that such a technique may be employed to test generally as to whether a laser has been successfully configured to generate a wavelength comb.

Figure 6:
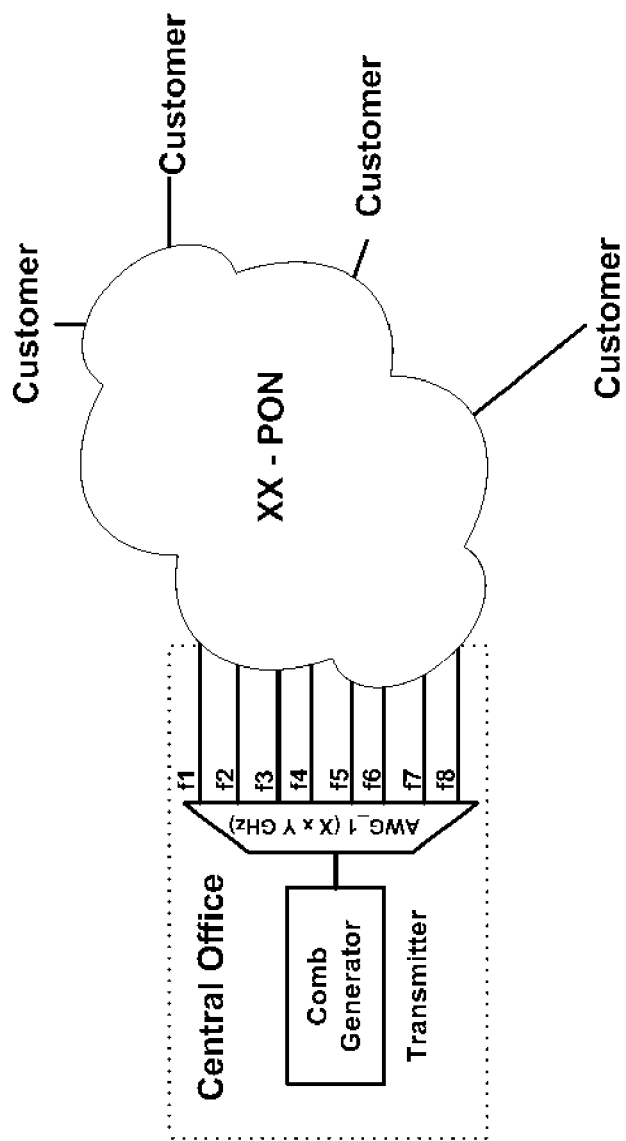
FIG. 6 is an exemplary use employing the comb generator of FIG. 2.

The comb generators described above may be used generally within fibre communications systems. More particularly, as the comb lasers are a lower cost than previous devices, their use allows for the provision of a lower cost transmitter, which would be suitable for systems bringing Fibre-To-The-Home (FTTH). More generally, the transmitters, because of their coherent nature, would be particularly suitable for Dense Wavelength Division Multiplexed systems. The lasers may also be employed in other applications, including for example, but not limited to, pulse generation, millimeter wave or terahertz signal generation, metrology and micro/millimeter wave clocks. An exemplary arrangement for using a comb laser as provided herein in a fibre optic communication system, as shown in FIG. 6, comprises the wavelength comb generator as described above. The output of the comb generator is provided to a splitter for separating the comb output into a plurality of individual wavelengths (f1-f8). These frequencies may then be provided over the fibre network to individual customers. The individual outputs may be individually modulated before transmission to the customers from the central office where the comb generator is located.

One particular application of this invention is for use as a low cost comb generation system at the central office in an optical communications system. This is configured as shown in FIG. 6, to distribute a number of signals to the customer:—

It will be appreciated that exemplary configurations of a wavelength comb generator device have been described to assist in an understanding of the present teaching. Modifications can be made to that described herein without departing from the scope of the present teaching as will be appreciated by those of ordinary skill. For those reasons it will be appreciated that the scope of the present teaching should be construed as limited only insofar as is deemed necessary in the light of the appended claims which follow.

The words comprises/comprising when used in this specification are to specify the presence of stated features, integers, steps or components but does not preclude the presence or addition of one or more other features, integers, steps, components or groups thereof.

The invention claimed is:

1. A wavelength comb generator device comprising:
    a single mode semiconductor laser having a relaxation oscillation frequency,
    a biasing circuit that provides a DC bias current,
    an RF signal generator that generates an RF signal at a frequency within 25% of the relaxation oscillation frequency of the single mode semiconductor laser, and
    a drive circuit that combines the generated RF signal with the DC bias current to provide a drive current that is a combination of the RF signal and DC bias current, the drive circuit coupled to supply the drive current to a gain section of the laser to cause the gain section to lase and provide a frequency-domain, phase-coherent, comb output, and
    an optical splitter positioned to separate individual frequencies of an output from the laser to provide a plurality of outputs from the laser device.

2. The comb generator according to claim 1, wherein the laser bias current is within 20% of a threshold current of the laser.

3. The comb generator device according to claim 1, wherein the RF signal generator is configured to generate a substantially sinusoidal RF signal.

4. The comb generator device according to claim 1, wherein the laser is temperature stabilised.

5. The comb generator device according to claim 1, wherein the optical splitter is an Arrayed Waveguide Grating.

6. A fibre optic communications system comprising:
    a single mode semiconductor laser having a relaxation oscillation frequency,
    a biasing circuit that provides a DC bias current of less than 60mA,
    an RF signal generator that generates an RF signal at a frequency within 25% of the relaxation oscillation frequency of the laser,
    a drive circuit that combines the generated RF signal with the less than 60mA DC bias current to provide a drive current to the laser to provide a frequency-domain, phase-coherent, comb output, wherein the drive causes the laser to lase,
    an optical splitter positioned to separate individual frequencies of an output from the laser to provide a plurality of outputs from the laser device; and
    a plurality of modulators, each modulator modulating an output from the splitter to provide a modulated output.

7. The fibre optic communications system according to claim 6, further comprising a plurality of fibre optic cables, each fibre coupled to receive a modulated output as an input.

8. A method of operating a single mode semiconductor laser, the method comprising:
    generating, via an RF signal generator communicably coupled to a single mode semiconductor laser, an RF signal at a frequency within 25% of a relaxation oscillation frequency of the single mode semiconductor laser,
    providing, via a biasing circuit communicably coupled to the single mode semiconductor laser, a DC bias current;
    combining the RF signal and DC bias current to provide a drive current;
    driving a gain section of the single mode semiconductor laser with the drive current; and
    generating, via the single mode semiconductor laser, a frequency-domain, phase-coherent, comb output using the provided DC bias current and the generated RF signal.

9. The method according to claim 8, wherein generating an RF signal at a frequency within 25% of a relaxation oscillation frequency of the single mode semiconductor laser comprises generating a substantially sinusoidal signal at a frequency within 25% of the relaxation oscillation frequency of the single mode semiconductor laser.

10. The method according to claim 8, wherein providing a DC bias current includes providing the DC bias current at a current level that is close to a threshold current level of the laser device.

11. The method according to claim 10, wherein providing the DC bias current at a current level that is close to a threshold current level of the laser device including providing the bias current with a current level that is within 20% of the threshold current level of the laser device.

12. The method according to claim 8, wherein the laser is temperature stabilised.

13. A method of manufacturing a comb generator device comprising:
    selecting a type of single mode semiconductor laser having a relaxation oscillation frequency,
    biasing the selected type of single mode semiconductor laser with a drive current comprising a DC bias current of less than 60mA and a generated RF signal, wherein the drive current causes the laser to lase, and
    adjusting the frequency of the generated RF signal to determine an optimum frequency of the generated RF signal to produce a desired frequency-domain, phase-coherent comb output, the optimum frequency within 25% of the relaxation oscillation frequency of the single mode semiconductor laser, and
    fabricating a laser device with a bias circuit having an output to provide a DC bias current and a RF signal generator having an output to provide a RF signal, and a drive circuit for combining the output from the DC bias circuit and the RF signal generator to provide a drive signal to the laser, wherein the RF signal generator is configured to operate at the determined optimum frequency.

14. The method according to claim 13, further comprising initially adjusting the bias current to determine an optimum bias current for the desired comb output and wherein the DC bias circuit is configured to operate at the determined optimum bias current.

15. The method according to claim 13, wherein the initial frequency of the RF signal is selected to be approximately a relaxation oscillation frequency of the laser type.

\* \* \* \* \*